US008854872B2

(12) United States Patent
Lam et al.

(10) Patent No.: US 8,854,872 B2
(45) Date of Patent: Oct. 7, 2014

(54) DRIFT MITIGATION FOR MULTI-BITS PHASE CHANGE MEMORY

(75) Inventors: Chung H. Lam, Peekskill, NY (US); Jing Li, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 13/335,237

(22) Filed: Dec. 22, 2011

(65) Prior Publication Data
US 2013/0163321 A1    Jun. 27, 2013

(51) Int. Cl.
G11C 11/00    (2006.01)

(52) U.S. Cl.
CPC .............. *G11C 11/00* (2013.01); *Y10S 977/754* (2013.01)
USPC ............ 365/163; 365/148; 365/153; 977/754

(58) Field of Classification Search
CPC ....................................... G11C 11/00
USPC ............. 365/46, 94, 100, 113, 129, 148, 158,
365/163; 257/2–5, 9, 296, 310, E21.35,
257/E31.047, E27.006; 438/29, 95, 96,
438/166, 135, 240, 259, 365, 482, 486, 597,
438/785; 977/754
See application file for complete search history.

(56) References Cited

U.S. PATENT DOCUMENTS

| | | | |
|---|---|---|---|
| 5,596,522 A | 1/1997 | Ovshinsky et al. | |
| 6,914,801 B2 | 7/2005 | Kostylev et al. | |
| 7,332,735 B2 | 2/2008 | Campbell | |
| 7,359,246 B2 | 4/2008 | Sforzin et al. | |
| 7,391,642 B2 | 6/2008 | Gordon et al. | |
| 7,417,900 B2 | 8/2008 | Rolandi et al. | |
| 7,420,851 B2 | 9/2008 | Fasoli | |
| 7,423,897 B2 | 9/2008 | Wicker | |
| 7,486,536 B2 | 2/2009 | Kim et al. | |
| 7,499,315 B2 | 3/2009 | Lowrey et al. | |
| 7,515,459 B2 | 4/2009 | Kang et al. | |

(Continued)

FOREIGN PATENT DOCUMENTS

EP            0 626 758 A2    11/1994

OTHER PUBLICATIONS

Papandreou et al., "Estimation of Amorphous Fraction in Multilevel Phase Change Memory Cell", Solid State Device Research Conference, 2009 ESSDERC'09, Proceeding of the European, IEEE, Piscataway, NJ.
International Search Report dated Oct. 30, 2012.

(Continued)

*Primary Examiner* — Harry W Byrne
(74) *Attorney, Agent, or Firm* — Scully, Scott, Murphy & Presser, P.C.; Daniel P. Morris, Esq.

(57) ABSTRACT

An RC-based sensing scheme to effectively sense the cell resistance of a programmed Phase Change Material (PCM) memory cell. The sensing scheme ensures the same physical configuration of each cell (after programming): same amorphous volume, same trap density/distribution, etc. The sensing scheme is based on a metric: the RC based sense amplifier implements two trigger points. The measured time interval between these two points is used as the metric to determine whether the programmed cell state, e.g., resistance, is programmed into desired value. The RC-based sensing scheme is embedded into an iterative PCM cell programming technique to ensure a tight distribution of resistance at each level after programming; and ensure the probability of level aliasing is very small, leading to less problematic drift.

11 Claims, 9 Drawing Sheets

(56) References Cited

U.S. PATENT DOCUMENTS

| | | |
|---|---|---|
| 7,554,861 B2 | 6/2009 | Vimercati et al. |
| 7,567,473 B2 | 7/2009 | Breitwisch et al. |
| 7,602,632 B2 | 10/2009 | Breitwisch et al. |
| 7,606,055 B2 | 10/2009 | Liu |
| 7,626,858 B2 | 12/2009 | Happ et al. |
| 7,656,710 B1 | 2/2010 | Wong |
| 7,660,147 B2 | 2/2010 | Chao et al. |
| 7,663,137 B2 | 2/2010 | Campbell |
| 7,663,618 B2 | 2/2010 | Svensson et al. |
| 7,684,227 B2 | 3/2010 | Liu et al. |
| 7,696,077 B2 | 4/2010 | Liu |
| 7,729,163 B2 | 6/2010 | Ramani et al. |
| 7,745,231 B2 | 6/2010 | Liu et al. |
| 7,754,522 B2 | 7/2010 | Liu |
| 7,755,939 B2 | 7/2010 | Tamada |
| 7,796,424 B2 | 9/2010 | Happ et al. |
| 7,817,475 B2 | 10/2010 | Lowrey |
| 7,929,338 B2 | 4/2011 | Franceschini et al. |
| 2007/0029537 A1 | 2/2007 | Campbell |
| 2007/0034905 A1 | 2/2007 | Elkins |
| 2007/0158631 A1 | 7/2007 | Daley et al. |
| 2007/0268742 A1 | 11/2007 | Liu |
| 2008/0014733 A1 | 1/2008 | Liu |
| 2008/0044632 A1 | 2/2008 | Liu et al. |
| 2008/0062752 A1 | 3/2008 | Giovinazzi et al. |
| 2008/0142773 A1 | 6/2008 | Campbell |
| 2008/0258125 A1 | 10/2008 | Liu et al. |
| 2008/0298113 A1 | 12/2008 | Liu et al. |
| 2008/0298114 A1 | 12/2008 | Liu et al. |
| 2009/0040811 A1 | 2/2009 | Kang et al. |
| 2009/0073785 A1 | 3/2009 | Breitwisch et al. |
| 2009/0196095 A1 | 8/2009 | Liu |
| 2009/0207652 A1 | 8/2009 | Nitta et al. |
| 2009/0213653 A1 | 8/2009 | Perlmutter et al. |
| 2009/0244961 A1 | 10/2009 | Ramani et al. |
| 2009/0244962 A1 | 10/2009 | Gordon et al. |
| 2009/0303783 A1* | 12/2009 | Lowrey .................. 365/163 |
| 2009/0303785 A1* | 12/2009 | Hwang et al. ............ 365/163 |
| 2010/0008163 A1 | 1/2010 | Liu |
| 2010/0027328 A1 | 2/2010 | Czubatyj et al. |
| 2010/0028421 A1 | 2/2010 | Cumming et al. |
| 2010/0034016 A1 | 2/2010 | Liu |
| 2010/0110779 A1 | 5/2010 | Liu et al. |
| 2010/0214830 A1 | 8/2010 | Franseschini et al. |
| 2011/0026318 A1 | 2/2011 | Franceschini et al. |

OTHER PUBLICATIONS

G.W. Burr et al., "Phase change memory technology," Journal of Vacuum Science & Technology B: Microelectronics and Nanometer Structures, vol. 28, No. 2, Mar./Apr. 2010, pp. 223-262.

S. Kostylev et al., "Drift of programmed resistance in electrical phase change memory devices," Proc. E*PCOS 2008, Prague, 2008, pp. 117-124.

D.-H. Kang et al., "Two-bit Cell Operation in Diode-Switch Phase Change Memory Cells with 90nm Technology," Symposium on VLSI Technology, 2008l pp. 98099.

Y.-H. Chiu et al., "Impact of Resistance Drift on Multilevel PCM Design,"IC Design and Technology, ICICDT, 2010, pp. 20-23.

\* cited by examiner

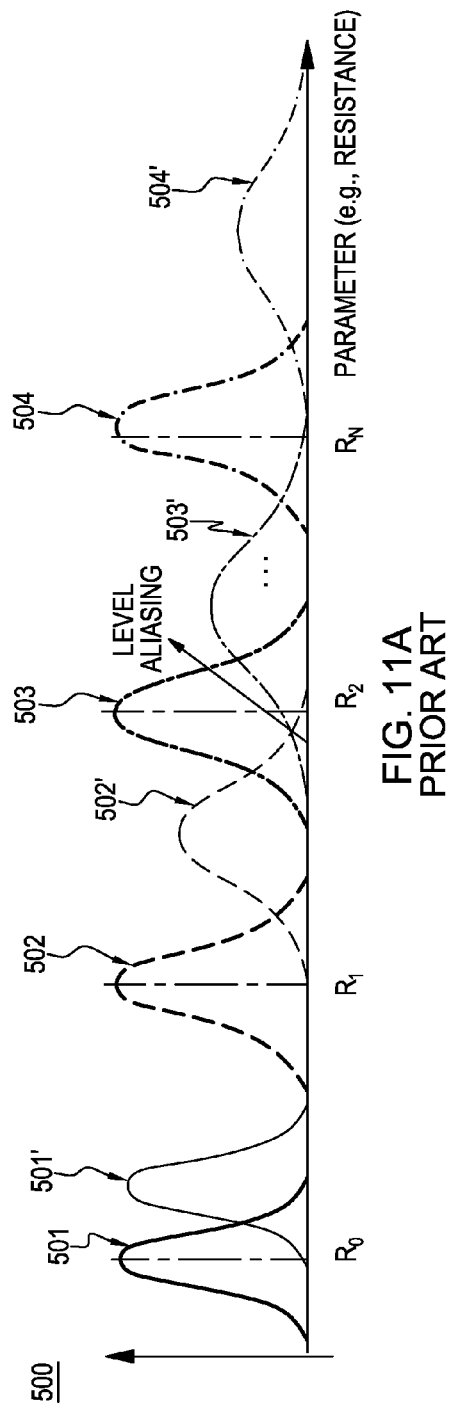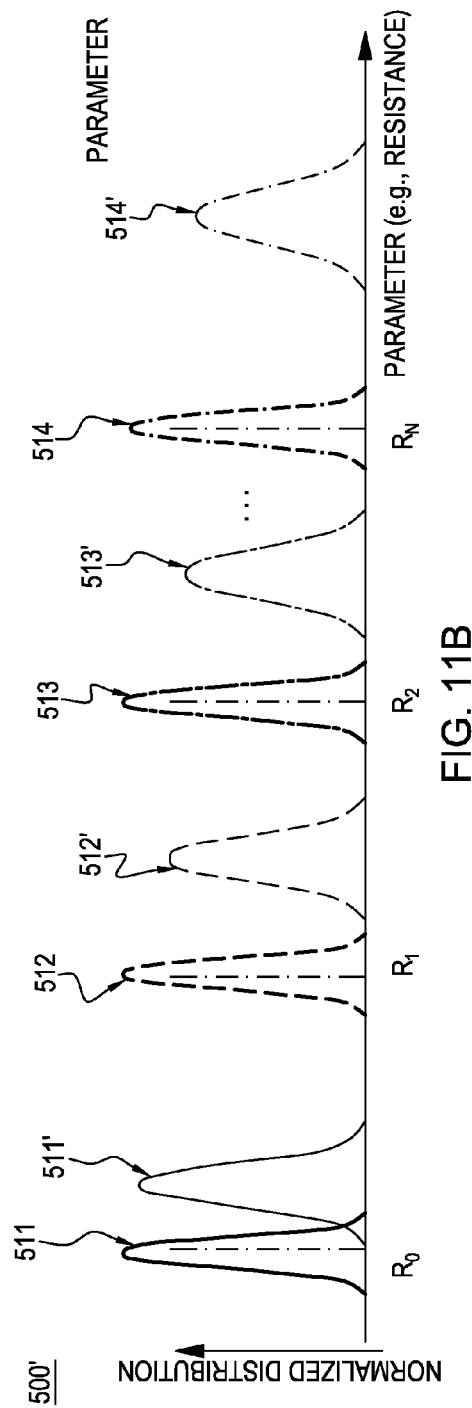

DRIFT MITIGATION FOR MULTI-BITS PHASE CHANGE MEMORY

BACKGROUND

The present invention relates generally to Phase Change Memory (PCM) cells and programming methods and more particularly to an improved system and method for more efficiently programming bits in multilevel PCM cells to mitigate drift.

A Phase Change Memory (PCM) cell includes a memory element of a phase change material having a first state, in which the phase change material is fully crystalline and has a minimum resistance level, a second state in which the phase change material is fully amorphous and has a maximum resistance level, and a plurality of intermediate states, in which the phase change material includes a mixture of both crystalline regions and amorphous regions having intermediate resistance values. As referred to herein, a cell or phase change material cell is any 2-dimensional or 3-dimensional structure that is formed of or includes a portion of phase change material. PCM materials include Chalcogenides which group of materials contain a chalcogen (Periodic Table Group 16/VIA) and another element. Selenium (Se) and tellurium (Te) are the two most common elements in the group used to produce a chalcogenide semiconductor when creating a phase change memory cell. An example of this would be Ge2Sb2Te5 (GST), SbTe, and In2Se3.

As known, the amorphous phase of a PCM tends to have high electrical resistivity, while the crystalline phase exhibits a low resistivity, e.g., orders of magnitude lower. Due to this large resistance contrast, the change in sensing signal between fully crystalline state and fully amorphous state is quite large, permitting for the immediate multiple analog levels needed for multi-level cell (MLC) operations.

In a PCM cell reset operation, a larger electrical current is applied in order to melt the central portion of the cell, and if this pulse is terminated abruptly, the molten material quenches into the amorphous phase, producing a cell in the high-resistance state. The reset operation tends to be fairly current and power hungry, and thus care must be taken to choose an access device capable of delivering high current and power without requiring a significantly larger footprint than the PCM element itself.

Typical semiconductor computer memories are fabricated on semiconductor substrates consisting of arrays of large number of physical memory cells. In general, one bit of binary data is represented as a variation of a physical or electrical parameter associated with a memory cell. Commonly used physical/electrical parameters include a threshold voltage, Vth, variation of Metal Oxide Field Effect Transistor (MOSFET) due to the amount of charge stored in a floating gate or a trap layer in nonvolatile Electrically Erasable Programmable Read Only Memory (EEPROM), or resistance variation of the phase change element in Phase-change Random Access Memory (PRAM).

Increasing the number of bits to be stored in a single physical semiconductor memory cell is an effective method to lower the manufacturing cost per bit. Multiple bits of data can also be stored in a single memory cell when variations of the physical parameter can be associated with multiple bit values. This multiple bits storage memory cell is commonly known as a Multi-Level Cell (MLC). Significant amount of effort in computer memory device and circuit designs is devoted to maximize the number of bits to be stored in a single physical memory cell. This is particularly true with storage class memory, e.g., non-volatile Flash memories commonly used as mass storage devices.

FIG. 2 depicts an example PCM cell 25 and a programming (e.g., write operation)/sensing (read operation) in an apparatus for performing read and write operations. Typically, an apparatus can program a PCM cell, for example, by a programmed current pulse applied through PCM cell 25 and a control access device (e.g., a transistor device) 30, e.g., a CMOS FET device. From known physical relations, resistance R is determined by fraction of amorphous size, amorphous material properties including trap states distribution, density, etc. and applied voltage V to the PCM cell 25.

In FIG. 2, the PCM cell 25 includes a bit line terminal 28 receiving programming voltage V. One transistor terminal (e.g., source or drain) of FET 30 connects the PCM cell at a second PCM or WL terminal. A gate of FET 30 provides a second PCM cell or wordline (WL) terminal 32 and connects to a wordline conductor WL. A third terminal of the FET device 30 (e.g., drain or source) is shown connected to a ground or neutral. In one embodiment, voltage present at the wordline (WL) terminal 32 in the manner as shown in FIG. 3B, configures the control access device, e.g., FET transistor 30, to control current flow through the PCM cell 25 as it is being programmed.

The electrical characteristics of the PCM cell 25 of FIG. 2 is governed according to known relations:

$$Icell = \frac{1}{R_0 \beta} \sinh(V_a \beta)$$

$$\beta = \frac{q \Delta z}{kT 2u_a}$$

$$R_0 = \frac{kT \tau_0 u_a}{q^2 A N_T \Delta z^2} e^{(E_c - E_F/kT)}$$

where $R_0$ is the low-field resistance value; $V_a$ is the applied voltage; $\beta$ is a sub-threshold slope; q is an elementary charge; $\Delta z$ is an average distance between two traps; k is the. Boltzmann constant; T is the temperature; and $u_a$ is the amorphous thickness; $N_T$ is a measure of the total effective trap density (a material property of the PCM cell); and the quantity $E_C - E_F$ is the distance between conduction band to Fermi level (a material property of the PCM cell). Thus, it is clear that current is an exponential function of supply voltage ($V_a$) and, further, that drift is mainly due to exponential term ($E_C - E_F$) and total effective trap density $N_T$ which vary with time.

Further, known in the industry for programming a PCM memory cell is an iterative technique implemented for adaptively controlling the amplitude of each programming pulse in a sequence of write-verify steps. That is, in a prior art methodology, to achieve multiple resistance levels in a PCM cell, there is typically implemented a programmed algorithm to provide a current pulse used to program the (desired) resistance value for a PCM bit.

FIG. 3 depicts a known implementation of an iterative write system and methodology implemented for adaptively controlling the amplitude of each programming pulse in a write-verify sequence 50. In the write-verify method, the voltage at the wordline is first SET/RESET by application of a pulse 52 to place the cell in an initial state and, with the bitline terminal held at a constant voltage, a next pulse 54a is injected at the WL terminal 32 that is immediately followed by a read operation 55 for reading in the programmed PCM cell value resulting from the application of signal 54a injected at the wordline terminal. Although not shown in FIG. 3, the read value is evaluated according to a programmed reference parameter value, e.g., a programmed reference resistance state ($R_{ref}$), and the calculated difference (e.g., error) is processed and fedback to a signal generator to provide a next pulse value shown as 54b for application to the WL terminal 32 immediately followed by a read operation 55 for reading in the programmed PCM cell value resulting from the application of signal 54b injected at the wordline terminal. If, as evaluated by processing after a read operation 55, the intended programmed reference resistance state ($R_{ref}$) is still not achieved, then, based on an error difference, further steps may be employed to apply a next calculated WL pulse 54c for injection at the WL terminal 32 immediately followed by the read operation 55 for reading in the programmed PCM cell value resulting from the application of signal 54c and verifying whether the programmed resistance value had been achieved. The write-verify iterative process continues executing these steps until the programmed target ($R_{ref}$) parameter value, e.g., resistance, for that cell (or bit) has been reached.

It is understood that, in the embodiment depicted in FIG. 3, the pulse voltages 54a, 54b, etc., can be applied to the PCM cell WL terminal 32 (while keeping the voltage at BL terminal 28 constant); or the pulse voltages 54a, 54b, etc., can be applied to the PCM BL terminal 28 while keeping voltage at the WL terminal 32 constant. In either application, for each iteration, the state of the memory cell is always initialized, making it highest R (e.g., fully RESET the cell) or making it lowest R (e.g., fully SET the cell), then perform iterative programming-verify operation.

Thus, in view of FIG. 3, Phase Change Memory resistance can be programmed into different resistance states. For a collection of cells, process induced variations cause distributions of resistance for a target resistance level. That is, the characterized different amorphous volume and different trap density/distributions in amorphous material further results in different drift behavior of the PCM cells and broadening of distributions. The broadened distribution may cause overlap between neighboring levels, leading to cell failures.

One basic requirement for multiple bit storage in a semiconductor memory cell is to have the spectrum of the physical or electrical parameter variation, e.g., PCM cell resistance, to accommodate multiple non-overlapping bands of values. As shown in FIG. 1, the number of bands required for an n-bit cell is $2^n$. A 2-bit cell needs 4 bands, a 3-bit cell needs 8 bands, and so forth. Thus, the available spectrum of a physical or electrical parameter in a semiconductor memory cell is typically the limiting factor for multiple bit memory storage.

FIG. 11A shows a plot 500 of an example distribution of programmed (resistive) states in programmed multi-bit memory structures. For example, programmed resistance states 501, 502, 503 and 504 are shown depicting an original resistance distribution before exhibiting a drift phenomenon where the resistivity of the amorphous phase increases with time (drift). As a result of structural relaxation, the programmed resistance states experience drift over time as shown as corresponding distributions after drift shown as distributions 501', 502', 503' and 504'. Drift spans a broad time-scale—from ns to the limit of observation time. Drift is typically modeled by the equation empirically:

$$R(t) = R_0 \left(\frac{t}{t_0}\right)^v$$

where the drift exponent (v) is proportional to the volume of the amorphous material in the active region of a PCM cell. The drift exponent also varies with the trap configuration and density within the amorphous volume. Drift also has temperature dependency. As drift is a stochastic phenomenon—it can be treated as noise. It adversely affects the reliability of stored levels in multilevel-cell PCM, leading to operational failures of the cell. For instance, drift phenomena may cause overlap of different resistance states 502, 503 as shown as resulting resistive state distribution 502' overlapping with resulting resistive state distribution 503' as shown in FIG. 11A that may result in operational failure of a memory cell.

FIG. 4 shows a plot 70 depicting an example programmed voltage curve 71 applied to the PCM cell and the resulting PCM cell Resistance values 73 as a function of the applied voltages 78. As shown in FIG. 4, the plot of the curve 71 shows, in the example, two adaptive write-verify iterations 74 and 75 (at k=2) with each iteration applying a modified current (voltage) required to minimize an error and achieve the programmed resistance value in the example PCM cell ($R_{REF}$). In the technique as shown in FIG. 4, there is provided the ability to adaptively control the amplitude of each programming pulse in a sequence of write-verify steps. In the control, utilization of the left slope portion 76 of curve includes a Low voltage regime that ultimately uses lower power consumption, and exhibiting higher cell endurance; however, this only enables one directional programming. As a consequence, the current techniques would requires re-initialization if undershoot. Utilization of the right slope portion 77 of curve 71 facilitates two directional programming which can avoid having to implement re-initializations; and, further can operate in a high voltage regime (leading to higher power consumption, and compromised cell endurance).

Even programming cell into the same resistance at particular read voltage based on either left slope or right slope or both, the amorphous thickness should be the same. Any characterized different amorphous thickness indicated different trap density/distributions in amorphous volume. The different trap density/distributions results in different drift behavior of the PCM cells.

In the current iterative write-verify techniques, a read operation is performed to verify cell programming. Typically, in such technique, a feedback is utilized in the form of a sensing circuit for use in sensing the programmed (resistive) state of the PCM cell. Typically, this sensing circuit implements an resistive-capacitive (RC) sensing scheme to effectively sense the time it takes for a floating bitline voltage level to decay to a pre-determined (e.g., reference) voltage value corresponding to the intended (programmed) PCM cell resistance value to ensure the intended resistance value has been achieved (after programming). FIG. 5 depicts a RC-based sensing circuit 20, used to sense the resistive state (R) of the programmed PCM cell 25. As shown in FIG. 5, the bitline is modeled as a capacitive load and the voltage of the floating bit line, $V_{BL}(t)$, at the PCM cell BL terminal 28 is measured.

As a consequence of programmed PCM cell behavior, different resistance levels result in different RC decay speed. Resistance levels can be differentiated by sensing various floating voltage delays on BL's according to RC time constant. That is, from an initial voltage level, e.g., applied during a pre-charge stage in which an initial (e.g., pre-charge) voltage $V_{BL}(0)$ is present on the bitline, after time t=0, the bitline voltage is measured as a function of time, ($V_{BL}(t)$), such that $$V_{BL}(t) = V_{BL}(0)\exp(-t/RC) \qquad 2)$$

where $V_{BL}(t)$ is the sensed bitline voltage of a floating bitline conductor as a function of time, and $V_{BL}(0)$ is a pre-charged bitline voltage present at time t=0. Different resistance levels i may be sensed according to formulae:

$$V_{BL}^i(t) = V_{BL}(0)\exp(-t/R_0^i C); \text{ and,}$$

$$t = R_0^i C * (\log V_{BL}(0) - \log V_{BL}^i(t))$$

where i is a resistance level (e.g., i~1, 2, ... 16 for a 4-bit MLC PCM cell) and $R=R_0^i$, where $R_0^i$ is the programmed resistance value for the level i. Thus, the a floating $V_{BL}^i(t)$ level associated with the intended resistance $R_0^i$ should decay according to a known time t to achieve a particular reference voltage $V_{BL}$ value corresponding to the intended resistance $R_0^i$ value. Although the measured time to achieve that particular reference voltage $V_{BL}$ value represents cell states, it does not indicate the same amorphous material properties (i.e., same trap density/distribution, etc.). Therefore, the programmed cell may be very susceptible in the future to (resistance) drift migration.

It would be highly desirable to provide an improved drift mitigation technique that minimizes drift during programming and improves memory reliability of programmed PCM cells.

Further, as an effort to reduce drift migration prevalent, an efficient sensing circuit is needed for determining whether the phase change memory cell is programmed into correct or desired values after the programming and less sensitive to drift in the future.

SUMMARY

The present invention addresses the needs described above by providing a system and method for mitigating resistance drift in programmed phase change PCM cells.

In one aspect, an improved RC-based sensing device and method is provided that effectively senses the PCM cell states and simultaneously measures material drift. The method effectively performs determining amorphous states of phase change material in a manner that provides an effective measure of material drift so that its impact on broadening of resistance distribution can be minimized at early programming phase. It ensures a systematic drift of resistance levels at any programmed level so that the neighboring levels won't overlap and hence won't cause cell failures.

Thus, in one aspect, there is provided a method for programming multiple levels into a phase change memory (PCM) cell, the memory cell having a PCM resistance of the memory cell characterized as subject to drifting over a period of time, the method comprising: applying, by a signal generator, at least one input signal to the memory cell; measuring at least one response signal of the memory cell; calculating a parameter which is based on the at least one response signal of the memory cell resulting from the configuration of the amorphous material in the memory cell, the parameter being sensitive to the resistance drift characteristic of the memory cell; and, determining a memory state and predicting a drift behavior of the memory cell based on the parameter.

In one aspect, the applied at least one input signal is a pre-charge voltage on a bit line conductor connecting a first terminal of the memory cell. The method further comprises: switching a word line access device connecting a second terminal of the memory cell to an on state, the response signal being a voltage decay rate measured at the first terminal of the memory cell.

Further to this aspect, the measuring the voltage decay rate at the first terminal comprises: sensing the time duration from after the switching of the word line access device to a time the response signal voltage crosses a first reference voltage level at the first terminal; and concurrently sensing the time duration from after the switching of the word line access device to the time the response signal voltage crosses a second reference voltage level at the first terminal; and, receiving, at a control logic device, the sensed first and second timing durations, and, determining, at the control logic device connecting the first terminal, a time interval value between crossing the first reference voltage level and crossing the second reference voltage level, wherein the parameter comprises the determined time interval value.

The technique is embedded in an iterative memory cell programming method, wherein, for each cell being programmed, the method comprises: determining by the control logic device, a modification of a pulse shape attribute of the at least one input signal, the modification based on a sensed memory cell state and the drift sensitive parameter information; and, generating, by the control logic device, a feedback signal representing the pulse shaped attribute modification for input to the signal generator, the signal generator generating the at least one input signal having a modified pulse shape attribute to one of: the first terminal, second terminal or both terminals of the memory at a next programming iteration cycle.

In a further aspect, there is provided an apparatus for sensing a programmed state of a phase change memory cell. The apparatus comprises: a signal generator for applying at least one input signal to the memory cell; a sensing unit for sensing at least one response signal of the memory cell; a control logic device for calculating a parameter which is based on the at least one response signal of the memory cell resulting from the configuration of the amorphous material in the memory cell, the parameter being sensitive to the resistance drift characteristic of the memory cell; and, the control logic device determining a memory state and predicting a drift behavior of the memory cell based on the calculated parameter.

In the apparatus, the applied at least one input signal is a pre-charge voltage on a bit line conductor connecting a first terminal of the memory cell. The apparatus further comprises: a switch device for switching a word line access device connecting a second terminal of the memory cell to an on state, the response signal being a voltage decay rate measured at the first terminal of the memory cell.

Further, the sensing unit comprises: a first sense amplifier for sensing a first time duration from after the switching of the word line access device to the at least one response signal crossing a first reference voltage level; and a second sense amplifier for sensing a second time duration from after the switching of the word line access device to the at least one response signal crossing a second reference voltage level.

Further, the apparatus comprises: a control logic device for receiving the sensed first and second timing durations and implementing logic for determining, at the control logic device, a time interval value between the at least one response signal crossing the first reference voltage level and crossing the second reference voltage level, wherein the parameter comprises the determined time interval value.

Further, in the apparatus, the first sense amplifier comprises a first input for receiving the first reference voltage signal, and having a second input connected with the first terminal of the memory cell for sensing the response signal voltage; and the second sense amplifier comprises a first input for receiving the second reference voltage level, and having a second input connected with the first terminal of the memory cell for sensing the response signal voltage.

Further, the control logic device iteratively programs a memory state in each cell, wherein at a programming iteration the control logic device further determines a modification of a pulse shape attribute of the at least one input signal, the modification based on a sensed memory cell state and the drift sensitive parameter; and, generates a feedback signal representing the pulse shaped attribute modification for input to the signal generator, the signal generator generating the at least one input signal having a modified pulse shape attribute to one of: the first terminal, second terminal or both terminals of the memory at a next programming iteration cycle.

In yet a further aspect, of the invention, there is provided a computer program product for performing operations. The computer program product includes a storage medium readable by a processing circuit and storing instructions run by the processing circuit for running a method. The method is the same as listed above.

BRIEF DESCRIPTION OF THE DRAWINGS

The objects, features and advantages of the invention are understood within the context of the Detailed Description, as set forth below. The Detailed Description is understood within the context of the accompanying drawings, which form a material part of this disclosure, wherein:

FIG. 11A shows a plot 500 of an example distribution of programmed (resistive) states immediately after programming and after drifting for certain time programmed according to a prior art technique; and, FIG. 11B shows a plot 500' of an example distribution of (resistive) states of multi-bit memory cell immediately after programming and after drifting for certain time such as in FIG. 11A however, programmed according to the write-verify programming methodology.

DETAILED DESCRIPTION

The RC-based sensing scheme for a PCM memory cell in one embodiment is used to sense programmed states of PCM cells. In one embodiment, the programmed states are multi-level resistive states. The sensing scheme not only detect cell state, but also predicts cell drift behavior.

In a further aspect, the sensing scheme may be embedded into a iterative write verify programming scheme so as to not only minimize programmed PCM cell states distribution, but to minimize their drift variability to ensure all programmed cells at each resistive state drift systematically, with no overlap between neighboring levels.

Figure 4:
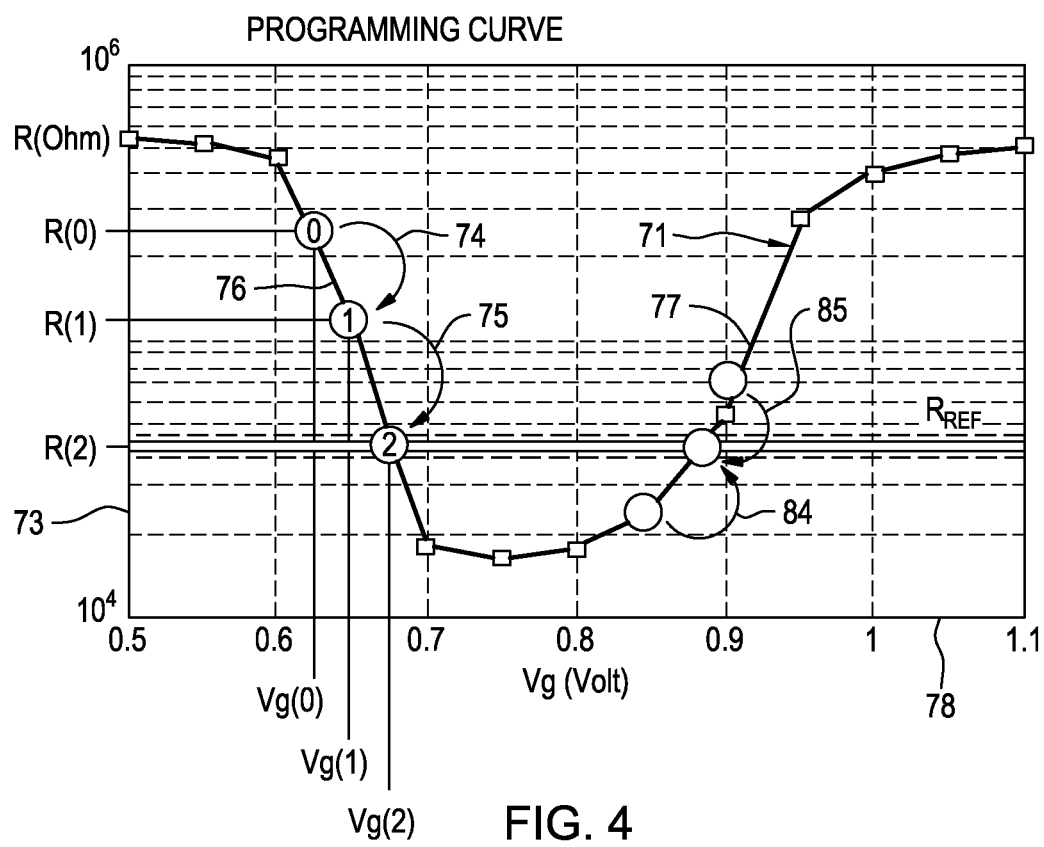
FIG. 4 shows a plot depicting an example programmed voltage curve applied to the PCM cell and the resulting PCM cell Resistance values as a function of the applied voltages.
Figure 5:
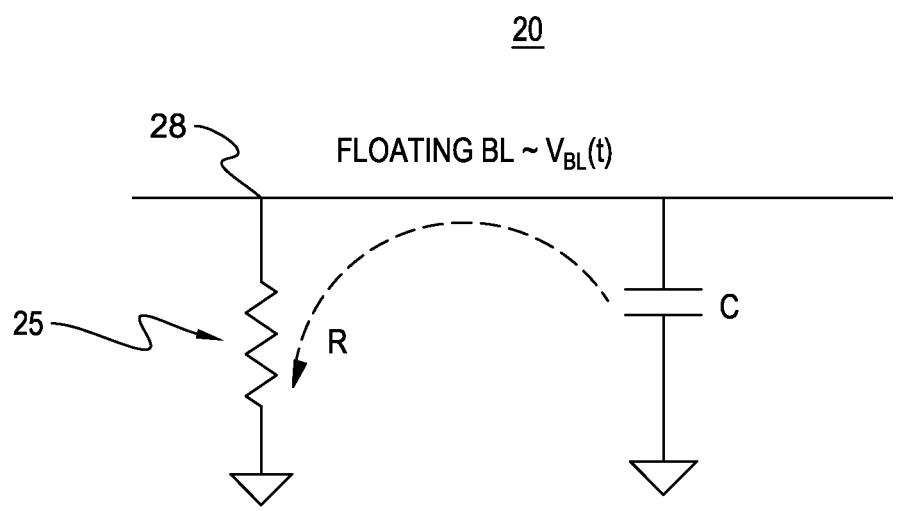
FIG. 5 depicts a conventional RC sensing circuit 20 currently used to sense the resistive state (R) of the programmed PCM cell.
Figure 6A:
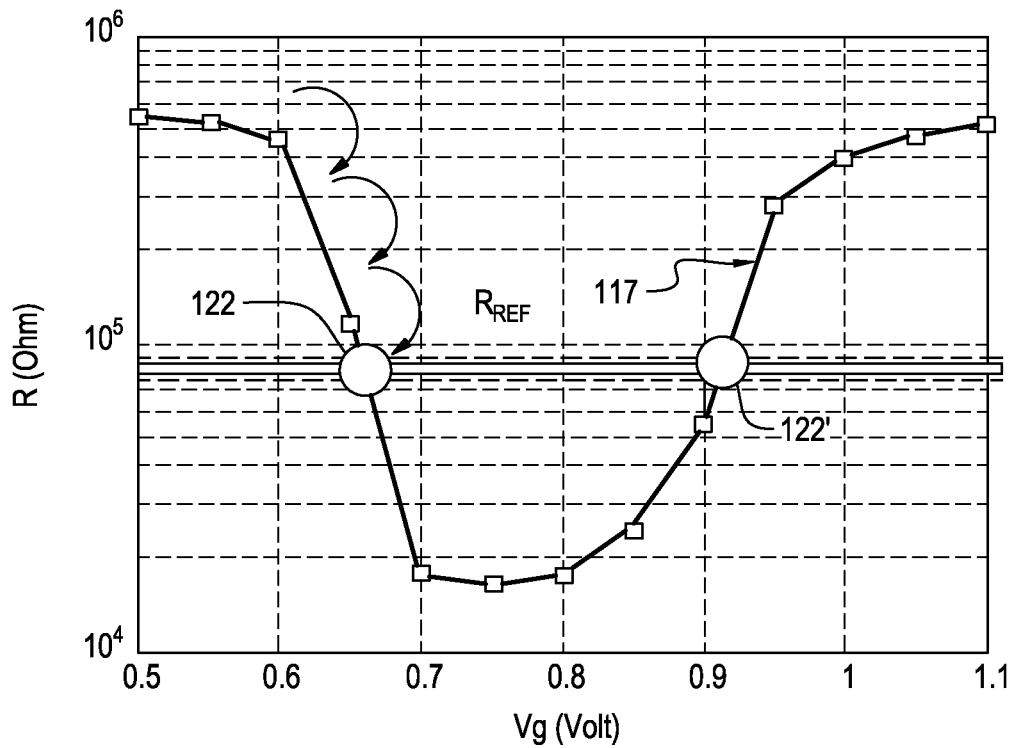
FIG. 6A shows example approaches for programming of a target resistance value governed according to a programmed resistance curve 117 in one embodiment, resulting in different amorphous material properties and hence very different drift behaviors.

As shown in FIG. 6A, the programming of a target resistance value in a PCM cell by an write programming apparatus is governed according to a programmed resistance curve such as the example U-shaped curve 117 (corresponding to the curve 71 shown in FIG. 4). At curve 117, the same target resistance value $R_{REF}$ 122, 122' can be obtained by various programming paths, e.g., either from left-slope approaches 74, 75, right-slope approaches 84, 85, or both). Even with the same resistance (e.g., $R_{REF}$ 122, 122' measured at a particular voltage point), the physical PCM cell configuration can be different (different trap distribution/density, etc. in amorphous material) which is the major reason for dramatically different drift behavior for cells programmed into the same cell state. Various drift behavior of cells in the same state ultimately leads to broadening of resistance distributions and may even cause cell failures. In order to reduce drift induced broadening (variability) of resistance distribution, the variation in trap distribution/density should be minimized. In one embodiment, increasing the number of trigger points during the performed sensing operation effectively detects variation in trap distribution/density and can be used as a measure to mitigate drift during programming.

As different resistance levels result in different RC decay speed between two trigger points, resistance levels can be differentiated by sensing various RC delay slope on BL's. An RC sensing scheme implements an RC sensing circuit that senses the cell resistance to ensure the same physical configuration of each cell (i.e., same amorphous volume, same trap density/distribution, etc.) after programming.

Figure 6B:
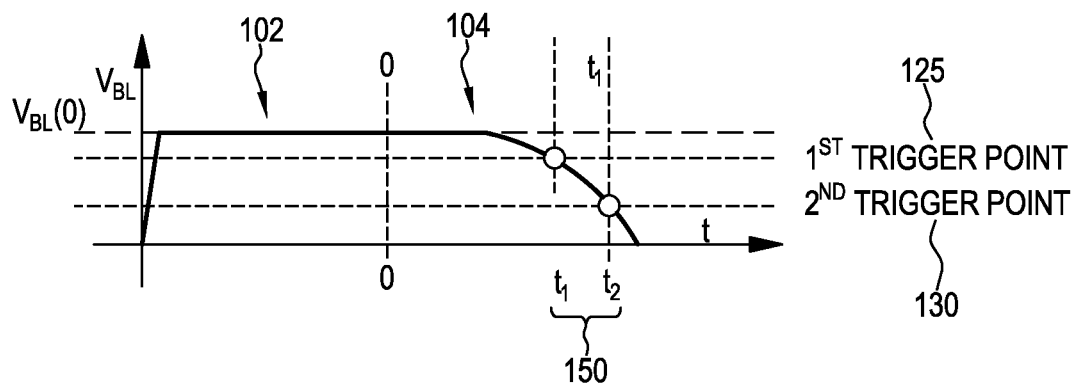
FIG. 6B depicts a RC-based sensing methodology used to detect cell states as well as to predict drift based on measured RC time delay between two trigger voltage points.

As shown in FIG. 6B, the sensing scheme is based on the following metric: the RC based sense amplifier performs sensing a floating bit line voltage based on two voltage trigger points: a first trigger point 125 and second trigger (voltage) point 130. The two trigger voltage points are pre-defined and set to correspond to respective voltage value that could be used as a measure of resistance levels and material drift. FIG. 6B particularly shows a plot of bitline voltage $V_{BL}$ after a time t=0 which is sensed as a function of time t. During the pre-charge phase 102, with the wordline access transistor off (disable a discharge path) a signal source that charges a BL to a constant voltage. During evaluation, the source is removed and at time t=0, an activation signal or pulse 210 is applied at the wordline terminal of the PCM cell to turn on access transistor 30 (enable a discharge path) and leave the PCM cell bit line terminal floating. Thus, starting at t=0, responsive to signal or pulse signal 210 at the wordline, the bit line voltage $V_{BL}(t)$ naturally decays as a function of time according to the time constant governed according to the programmed resistance value and (known) bitline load capacitance C. The bit line voltage $V_{BL}(t)$ at time t=0 is $V_{BL}(0)$ and the pre-charge voltage held at the bit line terminal (bitline voltage $V_{BL}$) starts to decay in a manner governed according to its programmed resistance value. This value is measured (sensed) and continuously compared against the two voltage reference (trigger) points. Two elapsed time values t1, t2, from time t=0 are measured corresponding to the time $V_{BL}(t)$ signal crosses the respective two trigger voltage values $V_{REF1}$ and $V_{REF2}$ as it decays. That is, a first time duration value (t1) is obtained from sensing circuit upon $V_{BL}(t)$ crossing $V_{REF1}$, e.g., at time t=t1; and a second time duration value (t2) is obtained from sensing circuit upon $V_{BL}(t)$ crossing $V_{REF1}$, e.g., at time t=t2. In one embodiment shown in FIG. 6B, the timing difference (interval) 150, i.e., a $\Delta t$=t2−t1 value elapsed between the two sensed voltage points, is used as a metric to determine whether the cell is programmed into the corresponding desired resistance state and whether it exhibits a desired material property state to be responsible for consequent drift behavior. That is, from the $\Delta t$ value a slope of the $V_{BL}(t)$ decay is computed which uniquely corresponds to a programmed state, e.g., resistive value, and further: provides resistance drift information: a potential to subsequently exhibit drift migration, e.g., due to the sensitivity of a material property such as the trap density, etc. A processor or like control device can compare the measured time metric (or decay slope) against a known time metric (or decay slope) value corresponding to the desired $R_0$ value programmed for a PCM cell known, e.g., tailored to exhibit minimized variation in PCM cell trap distribution/density. If the voltage slope obtained for the current programmed cell is different than the known decay rate, then the programmed value may have an amorphous thickness and/or trap density/distributions in amorphous volume resulting in a cell of that may be more susceptible to drift migration for that actual resistance value. The control processor will take corrective action by initiating a next writing step to reprogram the PCM cell for that state until the time metrics coincide or come to within a certain threshold.

In one embodiment, each programmed resistive state $R_{ref}$ of a PCM cell that is drift sensitive, is defined by two points: $R_{ref}(V_1)$ and $R_{ref}(V_2)$ with $V_1$ and $V_2$ corresponding to the programmed trigger points voltages 225, 230. The slope of the decay $V_{BL}$ against which $V_{BL}$ is measured while being sensed by sensing apparatus. The computed time difference 150 between the crossing the voltage $V_1$ and $V_2$ trigger points is the metric determining accuracy of that resistive state for that cell that is least susceptible to drift migration and enables tighter distributions when programming multiple bits.

Figure 7:
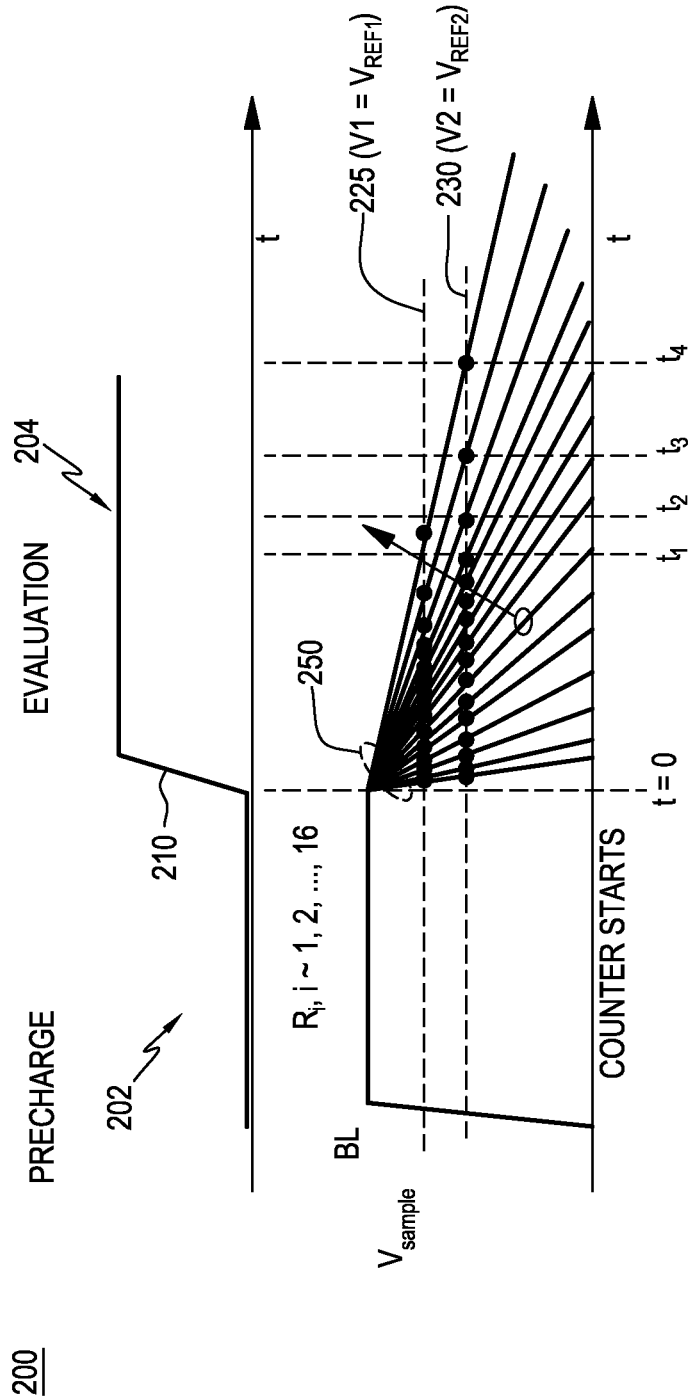
FIG. 7 depicts a timing diagram 200 depicts the sensing of 4 bits per cell using proposed technique in one embodiment.

As shown in FIG. 7, timing diagram 200 depicts the sensing of the bitline voltage $V_{BL}(t)$ as a function of time. In the example embodiment, a 4-bits memory cell is considered and the apparatus implementing the RC-based sensing scheme differentiates at least 16 BL RC delays 250 (for a programmed 4 bits memory cell having resistive states $R_i$, i~1, 2, ... 16). This is accomplished by, for example, by measuring by a sensing apparatus PCM cell voltage at a first (e.g., bit line connected) terminal using same two (2) trigger points 225, 230 for each resistive state as implemented in the sensing apparatus. In FIG. 7, in the pre-charge stage 202, a predetermined voltage level of constant value, e.g., $V_{SAMPLE}$, is applied at the bit line terminal of the bit programmed PCM cell with access transistor 30 off. In one embodiment, upon activation of a switch, or a control pulse or clock signal 210 provided by a signal generator, is applied to switch access transistor 30 on and remove the source voltage, $V_{SAMPLE}$ from the bitline terminal denoting a start time, e.g., time t=0, in evaluating (measuring) voltage decay at the first or bitline terminal 28 used to verify accuracy of a write step in a write-verify PCM cell programming apparatus.

At t=0, the control pulse or clock signal 210 is used to activate a sensing apparatus to initiate measuring the $V_{BL}(t)$ voltage decay and elapsed time between trigger points at the cell. In one embodiment, a timer or counter circuit apparatus is activated for use in determining the time interval metric associated with the accuracy of programmed physical PCM cell parameter, e.g., amorphous material within the cell. A sensing apparatus including sensing/counter circuitry is described in detail in connection with FIG. 8.

Figure 1:
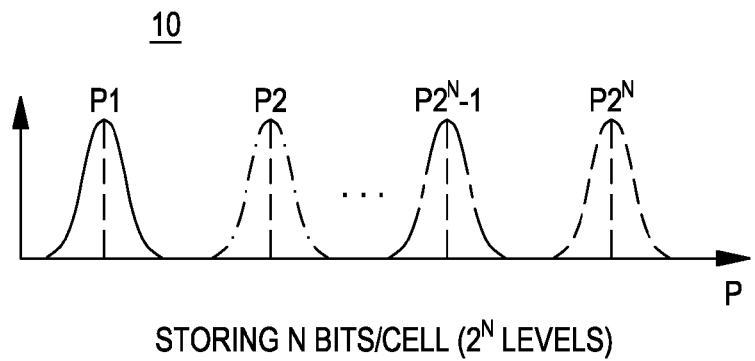
FIG. 1 shows an example multiple bit storage programming method for a PCM memory cell wherein the number of bands required for an n-bit cell is $2^n$.
Figure 2:
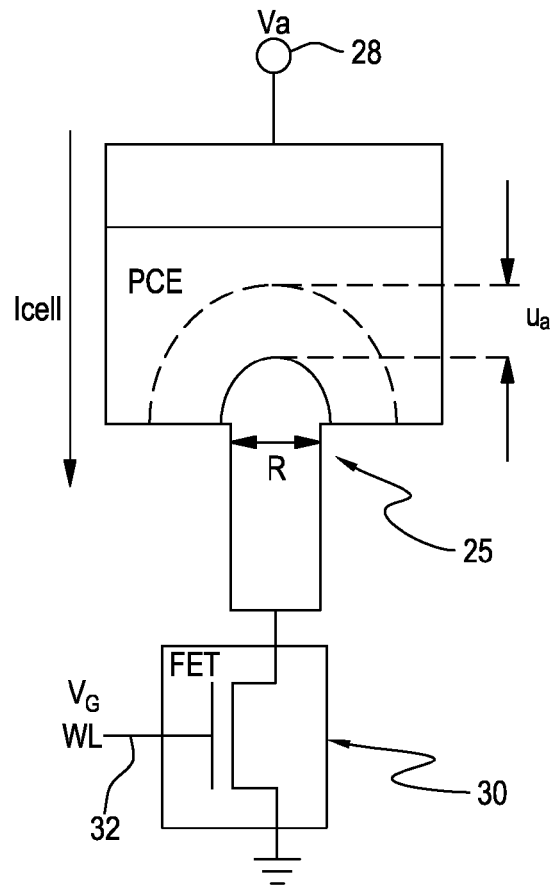
FIG. 2 depicts a schematic of an example PCM cell 25 subject to programming via the sequence of write-verify steps implemented according to an iterative write methodology of FIG. 3A.
Figure 3:
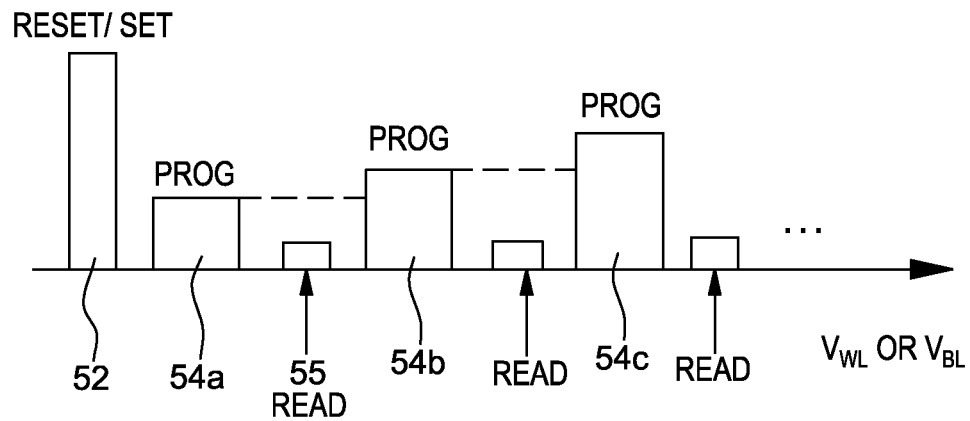
FIG. 3 illustrates an example schematic of an iterative write methodology implemented for adaptively controlling the amplitude of each PCM cell programming pulse as a sequence of write-verify steps.
Figure 8:
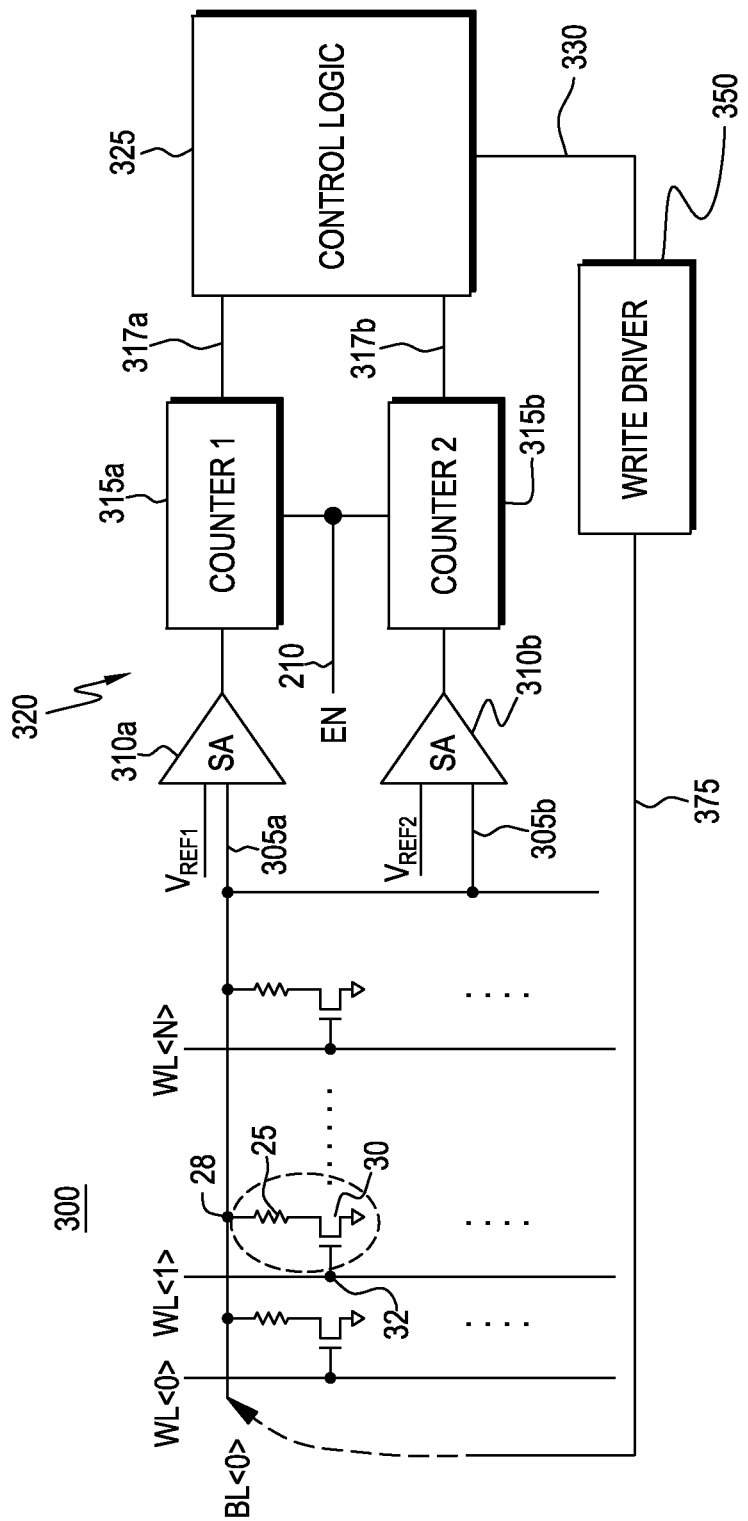
FIG. 8 depicts one example hardware apparatus for programming a phase change memory (PCM) cell that minimizes resistance drift for a programmed PCM cell resistance state.

A hardware apparatus 300 for programming a phase change memory (PCM) cell that minimizes the drift variability for programmed PCM cell resistance state, is now described in FIG. 8. The sensing scheme described with respect to FIG. 8 is one example embodiment, however, and may be used in conjunction with an iterative programming technique; including ones implementing write-verify steps as described with respect to FIG. 3A. The PCM memory cell is shown in FIG. 8 corresponds to the cell of FIG. 2 with the bitline terminal 28 connected to a particular bit line conductor shown as bit line BL<0> and wordline terminal 32 at the gate of the FET access transistor connects to a wordline conductor WL<1>.

Apparatus 300 includes a sensor sub-system 320 for sensing, after application of the clock or switch signal 210 the voltage decay at the bit line terminal 28, i.e., $V_{BL}(t)$, for a programmed cell as a function of a time as measured by respective counter devices 315a, 315b. The sensing apparatus 320 includes sense amplifiers 310a, 310b both having an input connecting a bit line terminal of the programmed PCM cell for sensing respective decay at the respective first and second trigger points V1 and V2. As shown in FIG. 8, each amplifiers 310a, 310b include or are embodied as a comparator device for receiving, at respective first inputs, the voltage trigger points: a first reference trigger point corresponding to $V_{REF1}$ at first input to the amplifier 310a, and, the second reference trigger point corresponding to $V_{REF2}$ at first input to the amplifier 310b. The bitline conductor having applied $V_{BL}(0)$ is simultaneously applied to each second input 305a, 305b of the respective amps 310a, 310b.

The first sense amplifier 310a senses the crossing of the $V_{BL}(t)$ at a voltage $V_{BL}(t)=V_{REF1}$=V1 at a first recorded time t1, and second amplifier 310b concurrently senses the crossing of the VBL(t) at a voltage $V_{BL}(t)=V_{REF2}$=V2 at a second recorded time t2.

A measuring sub-system for determining a time interval between achieving the first trigger point (voltage) level at the bit line terminal and achieving the second trigger point (voltage) level at the bit line terminal includes respective counter devices 315a, 315b, and implementation of programmed logic by control logic device, e.g., a programmed processor 325. Processor device 325 performs calculating a resistance parameter based on the $V_{BL}(t)$ response signal of the said memory cell, the parameter resulting from a configuration of amorphous material in the PCM memory cell. In the embodiment described herein, the parameter is sensitive to the resistance drift characteristic of the memory cell. The processor device determines a memory state of the memory cell based on the parameter. The computed time metric, the voltage decay slope and time interval indicates whether the corresponding bit value, represented as a physical parameter, e.g., resistance, has been programmed into that PCM memory cell. Further, this value also indicates the properties of amorphous material within the cell which governs drift and can be used as a metric to vary a pulse shape attribute of an applied pulse for the next programming cycle to mitigate drift in the future. The processor will communicate information representing the modification for receipt by the write driver, e.g., as feedback to a write apparatus to program the cell according to the evaluation.

In operation, at the time of activating switch pulse signal 210 to initiate measuring of the VBL(t) decay, the pulse 210 is received at enable input of two parallel operating counter device 315a, 315b that both activate to begin respective time count at a common start time. Upon amplifier 310a sensing the crossing of the $V_{BL}(t)$ at a voltage $V_{BL}(t)=V_{REF1}=V1$ at input 305a, the amplifier generates output signal that is input to the counter 315a to record its counting at a first recorded time, t1. Likewise, upon amplifier 310b sensing the crossing of the $V_{BL}(t)$ at a voltage $V_{BL}(t)=V_{REF2}=V2$ at input 305b, the amplifier generates output signal that is input to the counter 315b to record its counting at a second recorded time, t2.

The control logic 325 implemented receives the respective counter record times as signals 317a, 317b shown in FIG. 8. From these values, there is determined the time metric between the VBL(t) decay voltage crossing both V1 and V2 thresholds associated with the programmed level of states. This time interval value is also used as a material related drift sensitive parameter, i.e., the amorphous material properties, i.e., amorphous material volume, trap density/distribution, etc.

Then, the logic for determining from said first and second time count signals 317a, 317b the time interval includes, in one embodiment, determining a count difference between the first and second time count signals and comparing the count difference against a programmed threshold value, the iterative programming technique recursively storing the characteristic parameter in the memory cell to achieve a particular resistance level until the count difference is less than said threshold. PCM cell programming iteration continues until time interval $(t_2-t_i)$ is below a certain threshold, for example, keeps the same counter 315b and counter 315a output a value difference $\leq N_{th}$.

Then, the control logic 325, responsive to the determined time elapse, determines a manner in which a next programming pulse could be applied, e.g., in the write verify technique. This would include determining if any and which type(s) of pulse shape attribute modification to effect to the PCM cell write apparatus and communicate control signals 330, e.g., to the wordline and/or bitline write driver circuitry 350 utilized for generating and adaptively adjusting attribute(s) of pulse signals 375 utilized in writing bit values to a PCM memory cell, e.g., during the next write-verify iteration. These signals may be input to the BL Terminal 28 during PCM cell bit programming in an example embodiment.

Figure 10:
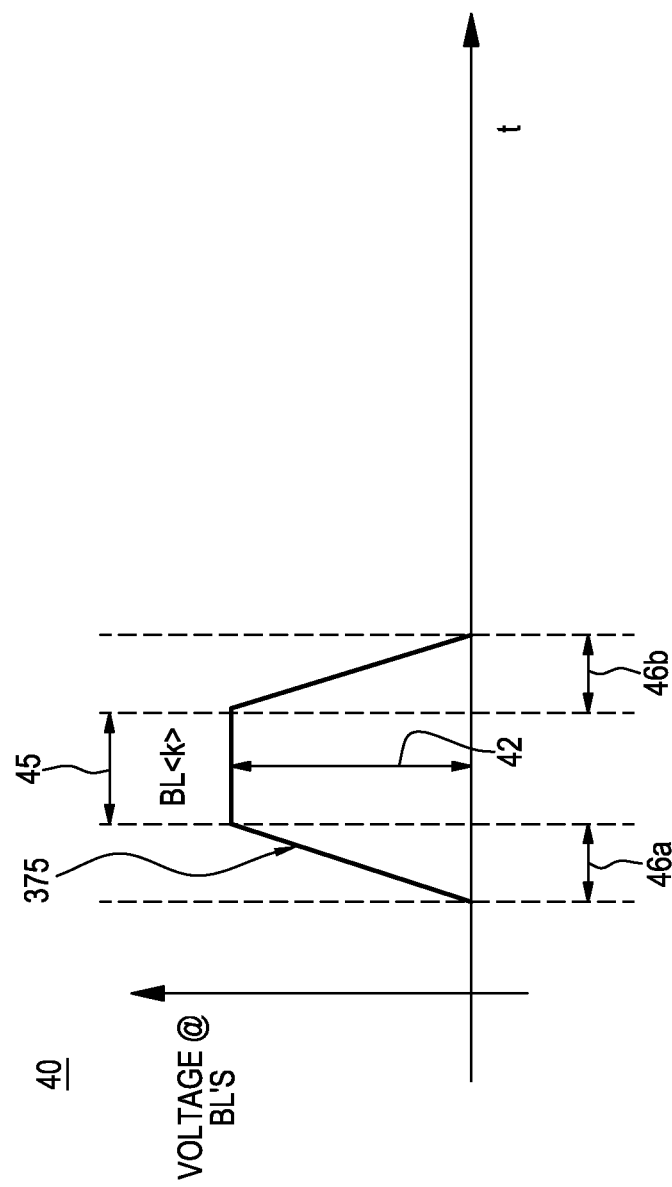
FIG. 10 illustrates the variety of pulse shape attributes applied for multi-level PCM cell according to the write-verify programming methodology 100 of FIG. 9.

In one embodiment, as shown in FIG. 10, the pulse shape attribute(s) 40 of adaptively programmed one or more pulse signals 375 applied at a respective BL, e.g., BL<i> while programming the PCM cell comprises: a pulse amplitude 42, a pulse duration 45, a length of rising edges 46a or trailing edges 46b of the one or more second pulse signals. It optionally may include a time delay attribute between two or more applied BL write pulse signals.

Figure 9:
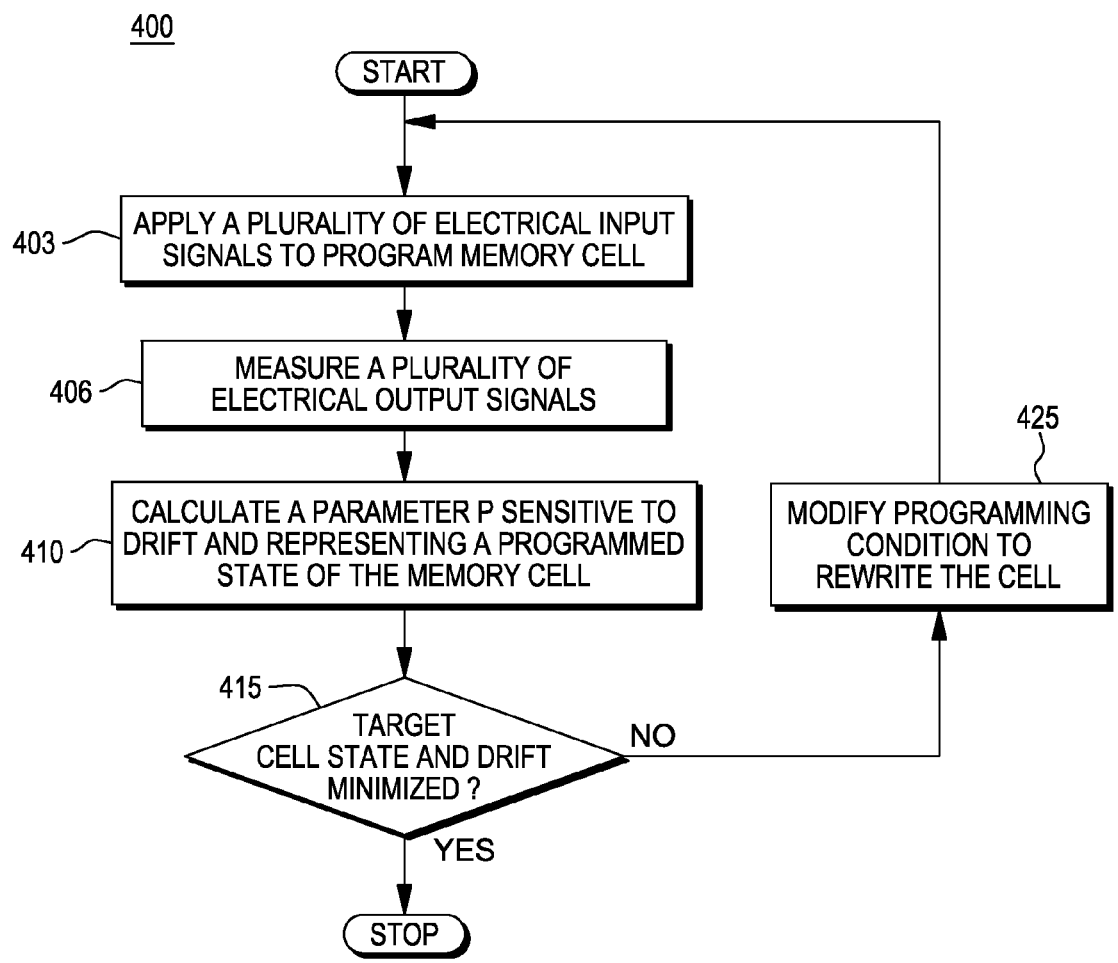
FIG. 9 illustrates a flow chart depicting the iterative write-verify programming methodology 100 used for mitigating drift phenomena when programming multi-level PCM cells according to one embodiment.

The sensing scheme of FIG. 8 may be operated in conjunction with an iterative programming technique 400 implementing, e.g., write-verify iteration steps, as now described with respect to FIG. 9. The method includes sensing a drift sensitive parameter and applying programming to mitigate that sensitivity. During programming, in a write-verify iterative scheme, there is applied at 403 one or more electrical input signals including, for example, pulse signals applied to one or both bit line terminal 28 and wordline terminal 32 of the PCM cell for programming a physical parameter into the cell to achieve a desired state, such as a resistance value corresponding to a programmed bit. Then, at 406, there is measured a plurality of electrical output signals in the manner such as described herein with respect to FIG. 8. These signals are evaluated as described herein to determine accuracy of the programmed physical parameter, e.g., a programmed resistance value, and to predict its consequent material-related drift behaviors. The method at 410 implementing the steps of FIG. 8 includes the sensing steps leading to calculating the parameter P (e.g., RC decay slope between two voltage trigger points) that is sensitive to drift and represents a programmed memory state of the memory cell, e.g. a bit value. The next step 415 performs determining whether the target cell state has been achieved and whether the drift variability is minimized. This determination results from the processing performed by control logic 325 shown in the apparatus of FIG. 8 which determines whether the programmed cell state (resistance) has been achieved according to the computed time interval metric or based on the measured voltage decay rate at the bitline terminal. Continuing, if it is determined that the target cell state has been achieved with minimum drift variability (in a manner that achieves a tight resistance distribution after drifting for certain time) such that systematic drift is achieved, the process ends for that cell. Otherwise, if it is determined at 415 that the target cell state has not been achieved in a manner such that drift variability may not be mitigated, then the process proceeds to 425 which entails the control logic processor 325 modifying the programming condition to re-write the programmed parameter in the cell, e.g., reprogram the PCM cell resistance. This step includes determining by the controller logic, a modification of a pulse attribute of a bitline pulse that is to be applied during parameter programming of the PCM cell at a next write-verify iteration that is performed again starting at step 403. For example, at each bit level, the counted time differences between the counter 1 and counter 2 devices should be less than $N_{thi}$, otherwise, the feedback logic will keep on writing until the desired value is obtained (iterative programming strategy) and drift variability is minimized.

In a further aspect, the RC based sensing technique described herein is implemented in a PCM memory array parallel programming apparatus such as described in commonly-owned, co-pending U.S. patent application Ser. No. 13/335,310, the whole contents and disclosure of which is incorporated by reference as if fully set forth herein, which describes a PCM cell memory array configuration and a method for programming (writing) multiple bits in parallel to a multi-level PCM cell (MLC). The method of the embodiments described herein ensures a tight distribution of resistance values when being programmed in parallel, and ensure that each physical configuration of the cell is the same; i.e., same amorphous volume, same trap density/distribution at each level after programming.

FIG. 11B shows a plot 500' depicting an example distribution of programmed (resistive) states in programmed multi-bit memory structures based on the RC-based sensing and iterative programming techniques described herein. Particularly shown are original distributions of programmed resistance states 511, 512, 513 and 514, e.g., corresponding to the original programmed resistance distribution states (e.g., multiple bits) 501, 502, 503, 504 shown in FIG. 11A, before exhibiting a drift phenomenon where the resistivity of the amorphous phase increases with time (drift). As shown in FIG. 11B, example programmed resistance states 511, 512, 513 and 514 are more accurate, as exhibited by the narrower distributions. The RC sensing based drift mitigation technique tightens the resistance distributions when programming multiple bits. Further, there is least effect of resistance drift as demonstrated by corresponding non-overlapping distributions 511', 512', 513' and 514' of programmed cells subjected to drift. That is, even with drift, the probability of two levels (e.g., levels 512' (corresponding to programmed resistance shown as distribution 512 subjected to drift) and level 513' (corresponding to programmed resistance shown as distribution 513 subjected to drift) overlapping with each other is negligible, if not completely avoided. As shown in FIG. 11B, even with drifting, the cell resistance distribution will be systematically shifted to higher value and the spread of distribution will not worsen.

The similar configuration of each cell also leads to systematic drift behavior across a whole wafer. That is, use of the drift sensitive sensing metric of a bit after programming, and using two points on a RC charge/discharge curve and time metric as described herein, provides data that is used by control logic to make an informed decision to whether to reprogram so that bits drift similarly. In essence, the bits are being programmed so they have similar initial resistance and resistance drift values.

In a further aspect, as described in greater detail in commonly-owned, co-pending U.S. patent application Ser. No. 13/335,155 the whole contents and disclosure of which is incorporated by reference as if fully set forth herein, the RC sensing technique and sensing apparatus may use or operate in conjunction with a PCM memory cell(s) programming apparatus employing an efficient word line row driver circuit utilizing an adiabatic computing approach which can generate slow ramping signals for use in the programming multiple PCM cell bits at a time without consuming any significant power.

Those skilled in art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, conventional processor, controller, microcontroller, state machine, etc. A processor can also be implemented as a combination of computing devices, e.g., a combination of a DSP and a microprocessor, a plurality of microprocessors, one or more microprocessors in conjunction with a DSP core, or any other such configuration. In addition, the term "processing" is a broad term meant to encompass several meanings including, for example, implementing program code, executing instructions, performing arithmetic operations, and the like.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, a DVD, or any other form of storage medium known in the art. A storage medium is coupled to the processor such that the processor can read information from, and write information to, the storage medium. In the alternative, the storage medium may be integral to the processor. The processor and the storage medium can reside in an ASIC. The ASIC can reside in a user terminal. In the alternative, the processor and the storage medium can reside as discrete components in a user terminal.

The modules can include, but are not limited to, any of the following: software or hardware components such as software object-oriented software components, class components and task components, processes, methods, functions, attributes, procedures, subroutines, segments of program code, drivers, firmware, microcode, circuitry, data, databases, data structures, tables, arrays, or variables.

The present invention is described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to embodiments thereof, it will be apparent that modifications and variations are possible without departing from the scope of the invention defined in the appended claims.

What is claimed is:

1. An apparatus for sensing a programmed memory state of a phase change memory cell comprising:
    a signal generator for applying at least one input signal to the memory cell;
    a sensing unit for sensing at least one response signal of the memory cell; and,
    a control logic device for calculating a parameter which is based on the at least one response signal of the said memory cell resulting from the configuration of the amorphous material in the said memory cell, the parameter being sensitive to the resistance drift characteristic of the memory cell; and,
    said control logic device determining a memory state and predicting a drift behavior of the memory cell based on the calculated parameter.

2. The apparatus of claim 1, wherein the applied at least one input signal is a pre-charge voltage on a bit line conductor connecting a first terminal of the memory cell, the apparatus further comprising:
    a switch device for switching a word line access device connecting a second terminal of the memory cell to an on state, the response signal being a voltage decay rate sensed by said sensing unit at the first terminal of the memory cell.

3. The apparatus of claim 2, wherein said sensing unit comprises:
    a first sense amplifier for sensing a first time duration from after said switching of said word line access device to the at least one response signal crossing a first reference voltage level; and
    a second sense amplifier for sensing a second time duration from after said switching of said word line access device to the at least one response signal crossing a second reference voltage level.

4. The apparatus of claim 3, further comprising:
    a control logic device for receiving said sensed first and second timing durations and implementing logic for determining, at said control logic device, a time interval value between the at least one response signal crossing said first reference voltage level and crossing said second reference voltage level,
    wherein said parameter comprises said determined time interval value.

5. The apparatus of claim 4, wherein said first sense amplifier comprises a first input for receiving said first reference voltage signal, and having a second input connected with said first terminal of the memory cell for sensing the response signal voltage; and said second sense amplifier comprises a first input for receiving said second reference voltage level, and having a second input connected with said first terminal of said memory cell for sensing the response signal voltage.

6. The apparatus of claim 5, wherein said control logic device further generates a feedback signal for input to said signal generator to control a pulse shape attribute of said applied at least one input signal to the memory cell.

7. The apparatus of claim 5, wherein said control logic device iteratively programs a memory state in each cell, wherein at a programming iteration said control logic device further determines a modification of a pulse shape attribute of the at least one input signal, said modification based on a sensed memory cell state and said drift sensitive parameter; and, generates a feedback signal representing said pulse shaped attribute modification for input to said signal generator, said signal generator generating said at least one input signal having a modified pulse shape attribute to one of: said first terminal, second terminal or both terminals of the memory at a next programming iteration cycle.

8. The apparatus of claim 6, wherein said pulse shape attribute of said applied at least one input signal to the memory cell comprises: a pulse amplitude, a pulse duration, a length of rising/trailing edges of said pulse signals used in programming said cell.

9. The apparatus of claim 7, wherein said iteratively programmed multiple resistive levels minimizes drift variability at each programmed cell state.

10. The apparatus of claim 3, wherein
    said first sense amplifier generates a first output trigger signal upon sensing the time duration from after said switching of said word line access device to the at least one response signal crossing said first reference voltage level; and
    said second sense amplifier generates a second output trigger signal upon sensing the time duration from after said switching of said word line access device to the at least one response signal crossing said second reference voltage level.

11. The apparatus of claim 10, further comprising:
    a counter device operatively connected to each said first voltage sense amplifier and second voltage sense amplifier for receiving respective said generated first trigger output and generated second trigger output signal;

a means for generating, at a time of switching said word line access device, an enable signal for receipt at said counter device, to initiate counting at said counter device, said counter device providing a first time count signal representing an elapsed time from application of said enable signal until receipt of said first trigger output signal and providing a second time count signal representing an elapsed time from application of said enable signal until receipt of said second trigger output signal; and, implementing, at said control logic device, logic for determining said time interval value from said first and second time count signals.

\* \* \* \* \*